United States Patent [19]
Brenner

[11] Patent Number: 5,799,030
[45] Date of Patent: Aug. 25, 1998

[54] SEMICONDUCTOR DEVICE WITH A LASER AND A PHOTODETECTOR IN A COMMON CONTAINER

[75] Inventor: Mary K. Brenner, Plymouth, Minn.

[73] Assignee: Honeywell Inc., Minneapolis, Minn.

[21] Appl. No.: 687,701

[22] Filed: Jul. 26, 1996

[51] Int. Cl.$^6$ ........................................................ H01S 3/19
[52] U.S. Cl. ............................................. 372/50; 372/96
[58] Field of Search ......................... 372/50, 96; 257/431, 257/457, 459

[56] References Cited

U.S. PATENT DOCUMENTS

| | | | |
|---|---|---|---|
| 5,031,187 | 7/1991 | Orenstein et al. | 372/50 |
| 5,115,442 | 5/1992 | Lee et al. | 372/45 |
| 5,237,581 | 8/1993 | Asada et al. | 372/45 |
| 5,245,622 | 9/1993 | Jewell et al. | 372/45 |
| 5,258,990 | 11/1993 | Olbright et al. | 372/46 |
| 5,331,654 | 7/1994 | Jewell et al. | 372/45 |
| 5,351,256 | 9/1994 | Schneider et al. | 372/45 |
| 5,359,447 | 10/1994 | Hahn et al. | 359/154 |
| 5,401,983 | 3/1995 | Jokerst et al. | 372/50 |
| 5,451,769 | 9/1995 | McAdoo et al. | 257/457 |
| 5,491,712 | 2/1996 | Lin et al. | 372/96 |
| 5,512,763 | 4/1996 | Allam | 257/21 |
| 5,568,502 | 10/1996 | Hironaka | 372/50 |
| 5,606,572 | 2/1997 | Swirhun et al. | 372/50 |
| 5,631,490 | 5/1997 | Dutta et al. | 257/457 |
| 5,648,979 | 7/1997 | Mun et al. | 372/50 |

FOREIGN PATENT DOCUMENTS 2-165684   6/1990   Japan ................................. 372/108

OTHER PUBLICATIONS

J. Jewell et al., "Surface-emitting Microlasers for photonic switching and interchip connections", Mar. 1990, Optical Engineering, vol. 29, No. 3.

D. Miller et al., "Optical bistability due to increasing absorption", May 1984, Optics Letters, vol. 9, No. 5.

R. Morgan et al., "Vertical-cavity surface-emitting laser arrays", (1995) SPIE, vol. 2398-09, Bellingham WA (no month).

R. Morgan et al., "Devices for Optical Processing", Jul. 1991, SPIE, vol. 1562.

R. Morgan et al., "Transverse Mode Control of Vertical-Cavity Top-Surface-Emitting Lasers", IEEE Photonics Technology Letters, vol. 4, No. 4, Apr. 1993.

R. Morgan et al., 200 °C., 96-nm Wavelength Range, Continuous-Wave Lasing from Unbonded GaAs MOVPE-Grown Vertical Cavity Surface-emitting lasers, IEEE Photonics Technology Letters, vol. 7, No. 5, May 1995.

*Primary Examiner*—James W. Davie
*Attorney, Agent, or Firm*—William D. Lanyi; Roland W. Norris

[57] ABSTRACT

A laser and photodetector are combined in a common package. This permits the photodetector to monitor the light intensity emitted by the laser. The laser and photodetector can be produced monolithically on a common chip to improve the accuracy of positioning of the various components. The device can be disposed within a common container having a window through which the emitted light passes. The window can be configured to have inside and outside surfaces that selectively reflect a portion of the light back to the photodetector while transmitting the remaining portion of the light through the window to a phototransmissive device, such as an optical fiber. The light reflected back to the photodetector can be focused in a predetermined pattern to cause the light to be accurately received by the photodetector and not fall on the laser.

30 Claims, 11 Drawing Sheets

SEMICONDUCTOR DEVICE WITH A LASER AND A PHOTODETECTOR IN A COMMON CONTAINER

BACKGROUND OF THE INVENTION

1. Field of the Invention

The present invention is generally related to lasers and photodetectors and, more particularly, to a single component having a container within which the laser and photodetector are disposed and arranged to permit the photodetector to receive reflected light from the laser.

2. Description of the Prior Art

Many different types of lasers are known to those skilled in the art. One type of laser, referred to as a vertical cavity surface emitting laser, or VCSEL, emits light in a single direction through an upper surface of the laser structure. Furthermore, many types of photodetectors are known to those skilled in the art. The photodetectors can be photodiodes, phototransisitors or any other photosensitive component. In certain applications, the emitted power from a laser must be monitored to determine whether the power of the emitted light exceeds certain predetermined threshold magnitudes. This monitoring function is used to avoid any possible danger from the emission of unacceptably high power levels from the laser. The monitoring function is also necessary in order to maintain required modulation rates and on/off extinction ratios.

An article titled "Surface-emitting Microlasers for Photonic Switching and Interchip Connections", published in Optical Engineering, March 1990, Volume 29 No. 3 by Jewell, Scherer, McCall, Olsson, Harbison and Florez describes vertical cavity electrically pumped surface emitting microlasers which are formed on gallium arsenide substrates at densities greater than two million per square centimeter. Two wafers were grown with indium gallium arsenide active material composing three quantum wells, 80 angstroms thick, in one and a single quantum well 100 angstroms thick in the other. Lasing was seen in devices as small as 1.5 micrometers diameter with less than 0.05 micrometers cube active material. Single quantum well microlasers 5×5 micrometer square had room temperature current thresholds as low as 1.5 milliampere with 983 nanometers output wavelength. Ten-by-ten micrometer square single quantum well microlasers were modulated by a pseudorandom bit generator at one Gb/s with less than $10^{-10}$ bit error rate. Pulsed output>170 milliwatt was obtained from a 100 micrometer square device. The laser output passes through a nominally transparent substrate and out of its back side, a configuration well suited for micro optic integration and photonic switching and interchip connections.

In an article titled "Vertical-Cavity Surface-Emitting Laser Arrays" by Morgan and Hibbs-Brenner, which appeared in SPIE Volume 2398, pages 65–93, on Feb. 6, 1995, the authors reviewed the state-of-the-art performance of producible 850 nanometer current guided gallium arsenide/aluminum gallium arsenide top emitting vertical cavity surface emitting lasers and arrays. The paper focuses on the flexibility of this technology platform in demonstrating a variety of devices and arrays. A 99.8 percent device yield across a three inch diameter metal organic vapor phase epitaxy grown wafer is demonstrated with this design. Recent progress in device performance have and will enable advances in VCSEL array based technologies. Included in the paper are unique ways of engineering lasing characteristics for single mode or incoherent emission. Array applications include one dimensional addressable arrays, particularly in the area of high speed optical data links.

In SPIE (Society of Photo-Optical Instrumentation Engineers) Volume 1562 (1991), an article titled "Devices for Optical processing" by Morgan, Chirovsky, Focht, Guth, Asom, Leibenguth, Robinson, Lee and Jewell reports on batch processed, totally planar, vertical cavity top surface emitting gallium arsenide/aluminum gallium arsenide laser devices and arrays. Different size devices are studied experimentally. The article describes the measurement of continuous wave threshold currents as low as 1.7 milliamperes and output powers greater than 3.7 milliwatts at room temperature. The article also discusses interesting characteristics such as differential quantum efficiencies exceeding unity and multitransverse mode behavior. An array having a 64 by 1 individually accessed elements is characterized and shown to have uniform room temperature continuous wave operating characteristics in threshold currents approximately equal to 2.1 milliamperes with a wavelength of approximately 849.4 nanometers and an output power of approximately 0.5 milliwatts.

U.S. Pat. No. 5,115,442, which was issued to Lee et al on May 19, 1992, discloses a top emitting surface emitting laser structure. Lasers of this type depend upon emission through apertured top surface electrodes. Biasing current, accordingly peripheral to the laser is introduced, follows the path which comes to confluence within the active region to effectively attain lasing threshold. The path is the consequence of a buried region of increasing resistance which encircles the laser at or above the active region. The buried region is produced by ion implantation-induced damage with ion energy magnitude and spectrum chosen to produce an appropriate resistance gradient integrated, as well as discrete, laser are contemplated by the patent. U.S. Pat. No. 5,115,442 is hereby explicitly incorporated by reference.

U.S. Pat. No. 5,031,187, which was issued to Orenstein et al on Jul. 9, 1991, discloses a planar array of vertical cavity surface emitting lasers. The device comprises an active region having a quantum well region disposed between two Bragg reflector mirrors separated by a wavelength of the emitting laser. A large area of the structure is grown on a substrate and then laterally defined by implanting conducting reducing ions into the upper mirror in areas around the lasers. Thereby, the laterally defined laser array remains planar. Such an array can be made matrix addressable by growing the structure on a conducting layer overlying an insulating substrate. After growth of the vertical structure, an etch or further implantation divides the conducting layer into strips forming bottom column electrodes. Top row electrodes are deposited in the perpendicular direction over the laterally defined top mirror. U.S. Pat. No. 5,013,187 is hereby explicitly incorporated by reference.

In IEEE Photonics Technology Letters, volume 4, no. 4 (April 1993), an article titled "Transverse Mode Control of Vertical-Cavity Top-Surface-Emitting Lasers" by Morgan, Guth, Focht, Asom, Kojima, Rogers and Callis discusses transverse mode characteristics and the control for vertical cavity top surface emitting lasers. It also describes a spatial filtering concept for the control of VCSEL transverse modes allowing the achievement of over 1.5 mW single TEM transverse mode emission from continuous wave electrically excited VCSEL's. It also shows that, without spatial filtering, L-I and V-I kinks can be observed.

U.S. Pat. No. 5,245,622, which was issued to Jewell et al on Sep. 14, 1993, describes a vertical cavity surface emitting laser with intra-cavity structures. The intra-cavity structures allow the vertical cavity surface emitting laser to achieve low series resistance, high power efficiencies and TEM$_{00}$ mode radiation. In one embodiment of the invention, a VCSEL comprises a laser cavity disposed between an upper and a lower mirror. The laser cavity comprises upper and lower spacer layers sandwiching an active region. A stratified electrode for conducting electrical current to the active region is disposed between the upper mirror and the upper spacer. The stratified electrode comprises a plurality of alternating high and low doped layers for achieving low series resistance without increasing the optical absorption. The VCSEL further comprises a current aperture as a disc shaped region formed in the stratified electrode for suppressing higher mode radiation. The current aperture is formed by reducing or eliminating the conductivity of the annular surrounding regions. In another embodiment, a metal contact layer having an optical aperture is formed within the upper mirror of the VCSEL. The optical aperture blocks the optical field in such a manner that it eliminates higher transverse mode lasing. U.S. Pat. No. 5,245,622 is hereby explicitly incorporated by reference.

U.S. Pat. No. 5,237,581, which was issued to Asada et al on Aug. 17, 1993, describes a semiconductor multilayer reflector and a light emitting device. The reflector includes a plurality of first quarter wavelength layers each having a high refractive index, a plurality of second quarter wavelength layers each having a low refractive index and high concentration impurity doping regions. The first and second layers are piled up alternately and each of the doping regions is formed at a heterointerface between the first and second layers. In this structure, the width and height of the potential barrier at the heterointerface becomes small so that tunnel current flowing through the multilayer reflector is increased. U.S. Pat. No. 5,237,581 is hereby explicitly incorporated by reference.

U.S. Pat. No. 5,258,990, which was issued to Olbright et al on Nov. 2, 1993, describes a visible light surface emitting semiconductor laser. The laser comprises a laser cavity sandwiched between two distributed Bragg reflectors. The laser cavity comprises a pair of spacer layers surrounding one or more active, optically emitting quantum well layers having a bandgap in the visible range which serves as the active optically emitting material of the device. The thickness of the laser cavity is defined as an integer multiplied by the wavelength and divided by twice the effective index of refraction of the cavity. Electrical pumping of the laser is achieved by heavily doping the bottom mirror and substrate to one conductivity type and heavily doping regions of the upper mirror with the opposite conductivity type to form a diode structure and applying a suitable voltage to the diode structure. Special embodiments of the invention for generating red, green and blue radiation are also described in this patent. U.S. Pat. No. 5,258,990 is hereby explicitly incorporated by reference.

U.S. Pat. No. 5,331,654, which was issued to Jewell et al on Jul. 19, 1994, discloses a polarized surface emitting laser. It describes a vertical cavity surface emitting semiconductor diode laser having a monolithic and planar surface and having lateral anisotropy in order to control the polarization of the emitted light beam. The diode laser includes a body of a semiconductor material having an active region therein which is adapted to generate radiation and emit the radiation from a surface of the body, and a separate reflecting mirror at opposite sides of the active region with at least one of the mirrors being partially transparent to the generated light to allow the light generated in the active region to be emitted therethrough. The anisotropy may be provided by utilizing anisotropy in the atomic or molecular structure of the materials forming the laser or by anisotropic patterning or deliberate offset alignment in processing of the laser or through anisotropic structures in the laser cavity to control the polarization of the emitted beam. U.S. Pat. No. 5,331,654 is hereby explicitly incorporated by reference.

U.S. Pat. No. 5,351,256, which was issued to Schneider et al on Sep. 27, 1994, describes an electrically injected visible vertical cavity surface emitting laser diode. Visible laser light output from an electrically injected vertical cavity surface emitting laser diode is enabled by the addition of phase matching spacer layers on either side of the active region to form the optical cavity. The spacer layers comprise indium aluminum phosphide which act as charge carrier confinement means. Distributed Bragg reflector layers are formed on either side of the optical cavity to act as mirrors. U.S. Pat. No. 5,351,256 is hereby explicitly incorporated by reference.

U.S. Pat. No. 5,359,447, which was issued to Hahn et al on Oct. 25, 1994, discloses an optical communication with vertical cavity surface emitting laser operating in multiple transverse modes. The communication system uses a relatively large area vertical cavity surface emitting laser. The laser has an opening larger than approximately 8 micrometers and is coupled to a multimode optical fiber. The laser is driven into multiple transverse mode operation, which includes multiple filamentation as well as operation in a single cavity. U.S. Pat. No. 5,359,447 is hereby explicitly incorporated by reference.

In IEEE Photonics Technology Letters, Volume 7, No. 5 (May 1995), an article entitled "200° C., 96-nm Wavelength Range, Continuous-Wave Lasing from Unbonded GaAs MOVPE-Grown Vertical Surface-Emitting Lasers" by Morgan, Hibb-Brenner, Marta, Walterson, Bounnak, Kalweit and Lehman describes record temperature and wavelength range that was attained through the use of MOVPE-grown AlGaAs vertical cavity surface-emitting lasers. Unbonded continuous-wave lasing is achieved at temperatures up to 200° C. from these top-emitting VCSEL's and operation over 96-nm wavelength regime near 850 nm is also achieved from the same nominal design. Temperature and wavelength insensitive operation is also demonstrated in this article and the threshold current is controlled to within a factor of 2 (2.5–5 mA) for a wavelength range exceeding 50 nm and to within 30 percent (5–10 mA) for a temperature range of 190° C. at 870 nm.

It would be significantly beneficial if a laser could be manufactured in such a way that a photodetector is disposed within a common container with the laser to receive reflected light and monitor the intensity of the laser's light emission.

SUMMARY OF THE INVENTION

A generally related invention is the subject of U.S. patent application Ser. No. 08/686,895, filed Jul. 26, 1996 and of common ownership herewith.

The present invention discloses several embodiments that are intended to help solve the problem of producing a laser and a photodetector in a common container wherein the photodetector can monitor light emitted from the laser and reflected by a window of the container. The present invention comprises both the structure that permits the laser and photodetector to be manufactured for placement within a common container and, furthermore, a method by which the light can be efficiently reflected from a window of the container back toward the photodetector.

One embodiment of the present invention comprises a laser and a photodetector, wherein the laser and the photodetector are disposed in a common structure. The common structure can be a monolithic semiconductive device on which the laser and photodetector are both manufactured concurrently and reside within a common semiconductor chip. Alternative embodiments could place a discrete laser on a previously manufactured photodetector to accomplish similar purposes.

In one embodiment of the present invention, the laser is a vertical cavity surface emitting laser, or VCSEL. The laser can comprise a plurality of layers which form a light emitting structure and the photodetector can comprise a photosensitive layer disposed over the light emitting structure. A portion of the photosensitive layer can be etched to form a cavity which exposes the light emitting structure beneath the photosensitive layer of the photodetector. In certain arrangements, the cavity can be surrounded by the photosensitive layer to place the laser in the center of a photodetector structure. Alternatively, the laser and the photosensitive layer can be arranged in a side by side relationship. The common container in which both the photodetector and the laser are disposed can be provided with a window that is partially reflective and partially transmissive. A portion of the light emitted by the laser is then reflected back toward the photodetector.

One embodiment of the present invention provides a means for efficiently reflecting the light from the laser back toward the photodetector. That embodiment of the present invention comprises a laser, a photodetector and a container with a window. The laser and the photodetector are disposed in a common structure within the container. The window is partially reflective and partially transmissive and has an inside surface facing the laser and the photodetector. The window also has an outside surface facing away from the laser and the photodetector. The inside surface is shaped to reflect light from the laser toward the photodetector in a first predetermined pattern which avoids the laser. In other words, the reflected light from the inside surface of the window is directed toward regions of the photodetector but not toward the laser. The outside surface of the window can be shaped to transmit and focus light from the laser in a second predetermined pattern. This second predetermined pattern can concentrate the light from the laser on a light transmissive member, such as an optical fiber. The first predetermined pattern can be an annular shape that surrounds the laser. In a particularly preferred embodiment of the present invention, the inside and outside surfaces of the window cooperate to reflect a portion of the light back toward the photodetector in an annular pattern that avoids the laser while transmitting the remaining portion of the light in a focused beam through the window toward a light transmissive device, such as an optical fiber used in communications systems.

While the two primary embodiments of the present invention can be used in conjunction with each other, they can also be implemented in applications that do not require their combination.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Throughout the Description of the Preferred Embodiment, like components will be identified by like reference numerals and letters. The manufacture of a device which incorporates both a laser and a photodetector requires several sequential steps to be performed. The structure of the present invention will be described in terms of the sequential steps used to manufacture it.

Figure 1:
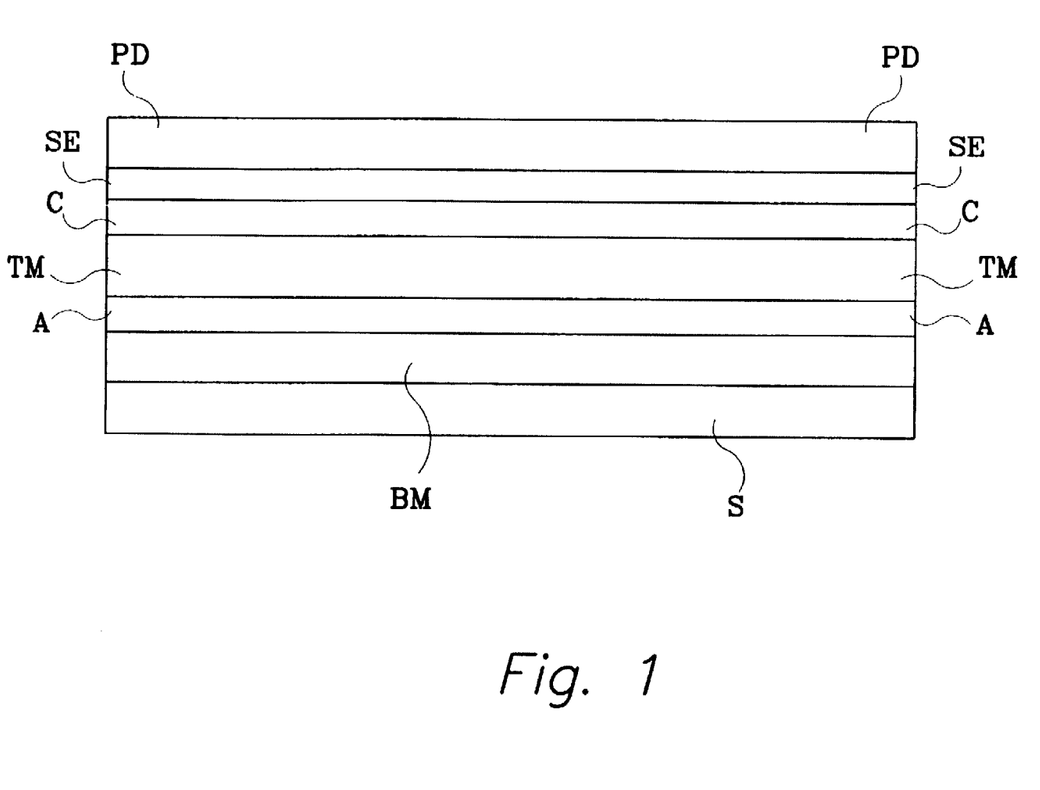
FIG. 1 shows a sectional view during an initial step of the manufacture of the present invention.

The structure shown in FIG. 1 is an intermediate structure produced by first providing a substrate S which can be gallium arsenide. A bottom mirror BM is disposed on the substrate. The bottom mirror can be an N-type mirror and, as understood by those skilled in the art, would typically comprise a plurality of individual layers of preselected thickness and material composition to provide the desired reflectance for a vertical cavity surface emitting laser. Above the bottom mirror BM is an active layer A on which a top mirror TM is disposed. As known to those skilled in the art and as described in great detail in the cited patents and papers described above, the structure of the top mirror typically comprises a plurality of individual layers of the appropriate thickness and material composition to result in the desired amount of reflectance and transmissiveness necessary to produce a vertical cavity surface emitting laser. The top mirror TM can typically be made of P-type conductivity material. A contact layer C is disposed on the top mirror and typically comprises highly doped P-type conductivity material. An etch stop layer SE is disposed on the contact layer C and an undoped photodetector layer PD is disposed on the etch stop layer SE.

With continued reference to FIG. 1, the substrate S is made of gallium arsenide, the bottom mirror BM comprises alternating layers of aluminum arsenide and gallium aluminum arsenide. The active layer A provides the quantum well of the laser and also incorporates the confinement layers necessary to confine the injected charge carriers to the quantum wells in the laser. The active layer typically comprises one or more quantum wells made of gallium arsenide material and the confinement layers typically comprise gallium aluminum arsenide. The top mirror TM comprises a plurality of alternating layers of aluminum arsenide and gallium aluminum arsenide. The contact layer C is made of gallium arsenide material and the etch stopping layer SE is made of aluminum arsenide or gallium indium phosphide. The photodetecting layer PD is made of gallium arsenide.

In a typical application of the present invention, the substrate S is approximately 625 microns thick, the total thickness of the plurality of stacks used to make the bottom mirror is approximately 4 microns thick, the active layer and confinement layers combine for a thickness of approximately 0.26 microns, and the plurality of layers used to provide the top mirror TM combined for a thickness of approximately 3 microns. The contact layer C is approximately 0.02 microns thick and the stop etch layer SE is approximately 0.02 microns thick. The photodetector layer PD is approximately 1 micron thick.

The structure shown in FIG. 1 illustrates an intermediate configuration of the present invention following the initial steps necessary to provide the plurality of layers shown. The manufacturing method used to produce the layers shown in FIG. 1 are well known to those skilled in the art. For example, all layers can be deposited using metal-organic vapor phase epitaxy (MOVPE) or molecular beam epitaxy (MBE).

Figures 2, 3:
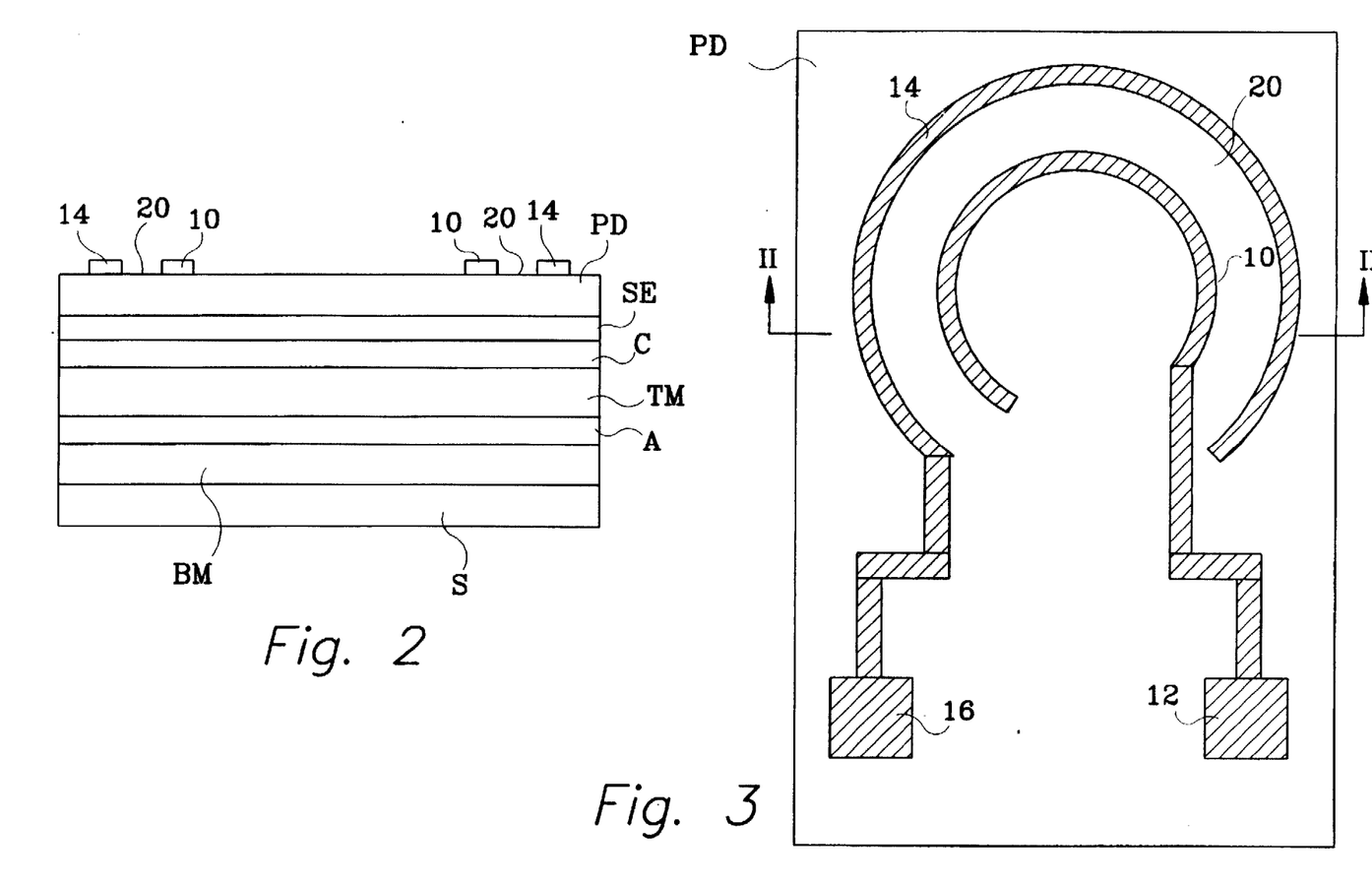
FIGS. 2 and 3 show side and top views during a subsequent step of the manufacturing of the present invention.

In FIGS. 2 and 3, side and top views are shown of the present invention during a subsequent step in the manufacturing process following the production of the intermediate device illustrated in FIG. 1. Two separate conductive members are disposed on the top surface of the photodetector layer PD. As can be seen in FIG. 3, these conductors are associated with each other to provide two generally concentric partial circles which are each connected to an individual contact pad. The inner circle 10 is connected to contact pad 12 and the outer circle 14 is connected to contact pad 16. Between these two concentric contact regions, a portion of the photodetective surface 20 is disposed. It should be understood that the entire surface in FIG. 3 on which the conductors, 10 and 14, are disposed is made of photosensitive material to provide the photodetector layer PD. However, the two conductors, 10 and 14, define a preselected portion 20 of the photosensitive material between them. This arrangement forms a metal-semiconductor-metal (MSM) photodiode between contact pad 12 and contact pad 16. As illustrated, FIG. 2 is a sectioned view of FIG. 3 taken through the central portion of the circular conductors as shown.

Figures 4, 5:
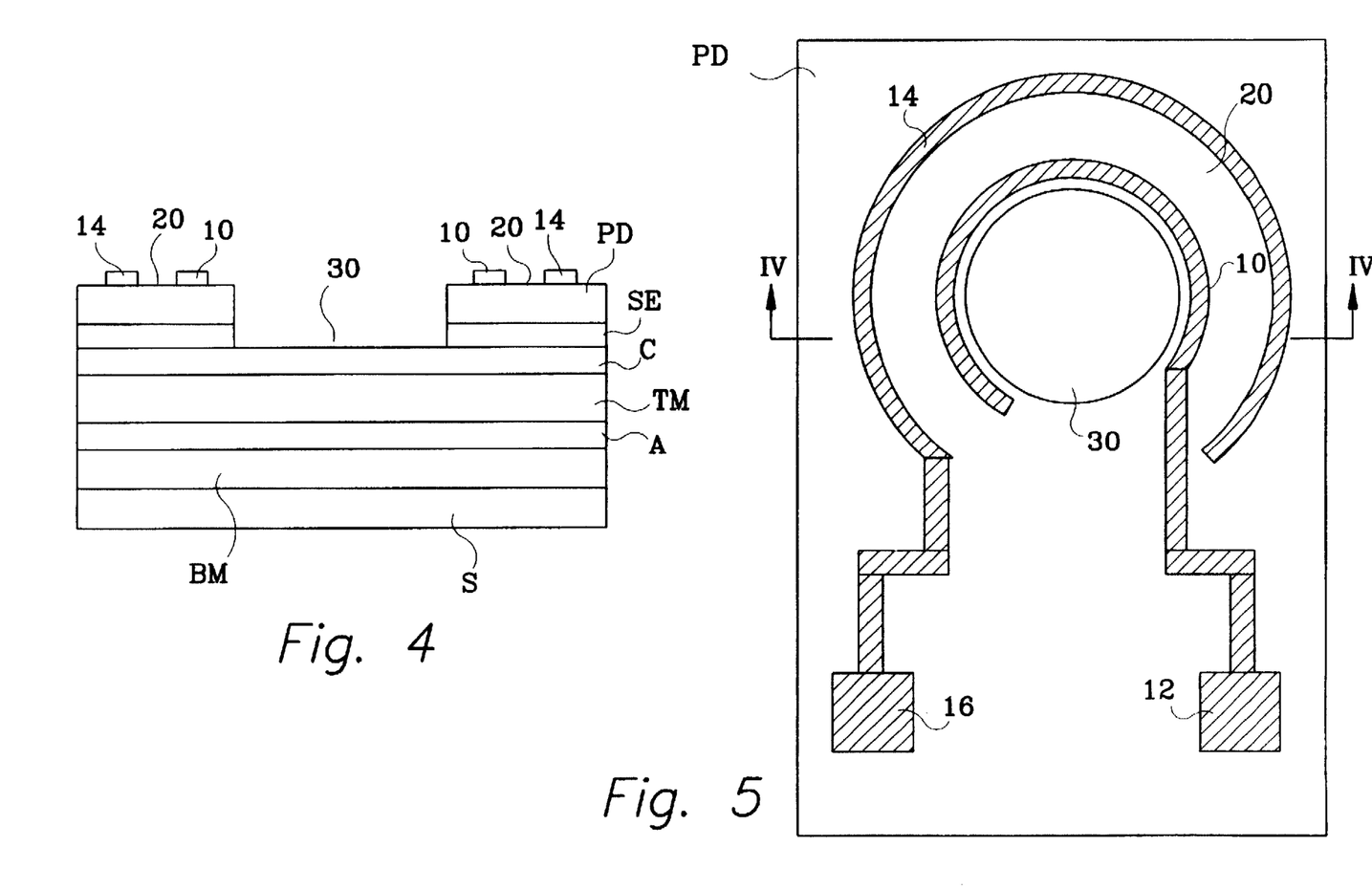
FIGS. 4 and 5 show the subsequent step following the configurations shown in FIGS. 2 and 3.

With reference to FIGS. 4 and 5, a subsequent step in the manufacture of the present invention comprises the step of etching a cavity 30 which, as illustrated in FIG. 4, removes a portion of the photodetector layer PD and the etch stop layer SE to expose the structure below these layers which comprises the layers of the laser. As can be seen in FIG. 5, the cavity 30 is generally surrounded by the photodetector layer 20 that lies between the two conductors, 10 and 14. Throughout this description of the present invention, the arrangement shown in FIG. 5 will be referred to as having the laser surrounded by the photodetector, but it should be realized that the photodetector portion 20 between the contacts, 10 and 14, does not totally surround the laser portion within the cavity 30. However, for purposes of simplicity, the arrangement shown in FIG. 5 will be described as having the laser surrounded by the photodetector.

Figures 6, 7:
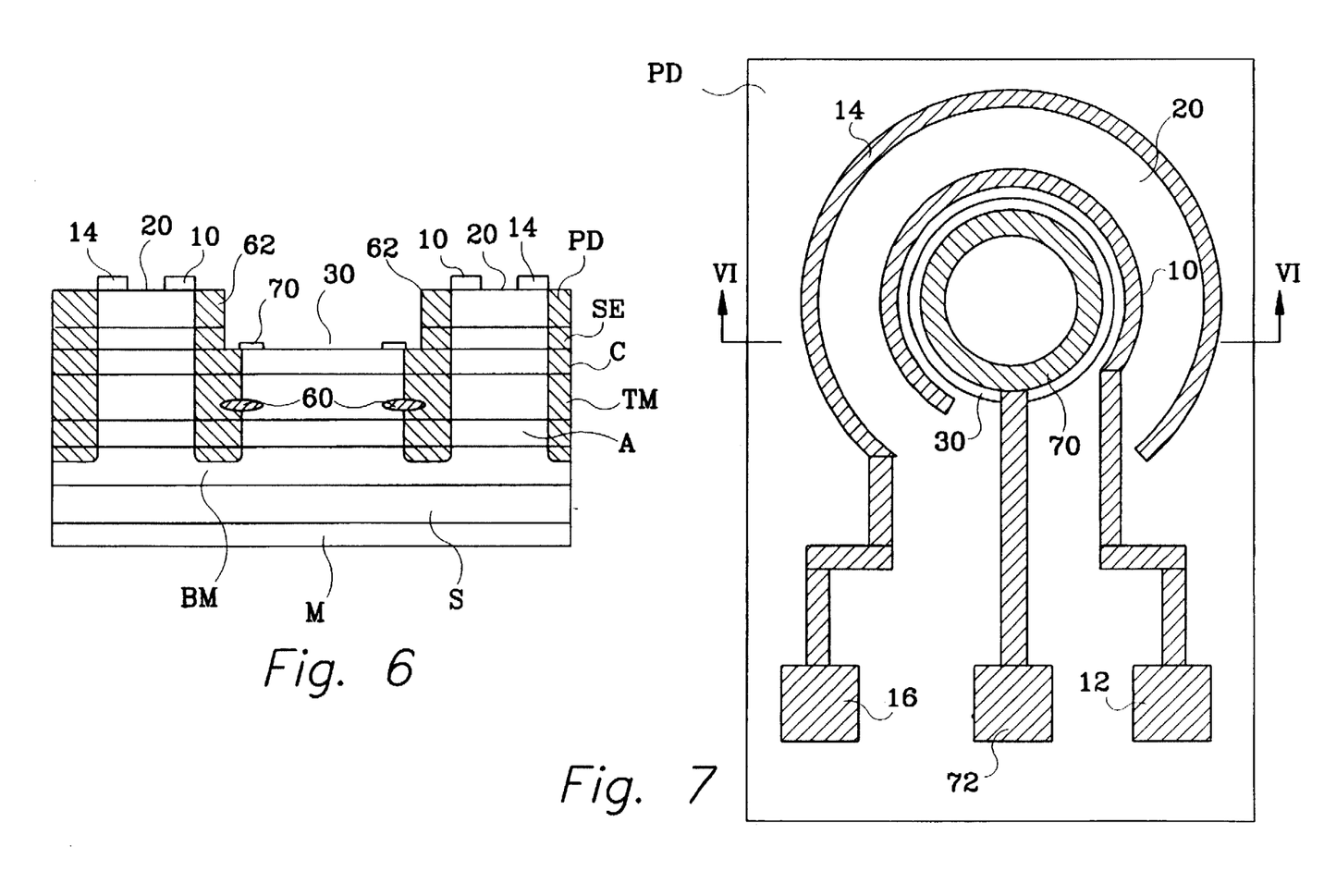
FIGS. 6 and 7 show side and top views following a subsequent step after the production of the devices shown in FIGS. 4 and 5.

FIGS. 6 and 7 illustrate the side and top views of the device following a subsequent manufacturing step. A gain guide implant 60 is produced by the step of ion implantation of hydrogen ions at a single energy to deposit the ions at a given depth and an isolation implant 62 is provided by the manufacturing step of ion implantation of hydrogen ions at multiple energies to distribute the ions from the region of the bottom mirror BM up to the top contact. The gain guide implant 60 is generally annular in shape and the isolation implant 62 is generally cylindrical in shape. These two implants are generally concentric with each other and with cavity 30. The function of the gain guide implant 60 is to guide current through the center of the laser and the function of the isolation implant 62 is to isolate the laser from neighboring devices. As can be seen, the gain guide implant is predominately disposed within the top mirror TM while the isolation implant extends through the photodetector layer PD, the etch stop layer SE, the contact layer C, the top mirror TM, the active layer A and part of the bottom mirror BM. A P-type ohmic metal contact 70 is disposed on the exposed surface of the contact layer C and shaped to extend to a contact pad 72 (FIG. 7). In addition, a back side N-type ohmic metal contact M is provided on the bottom surface of the structure shown in FIG. 6. The current flowing through the vertical cavity surface emitting laser will flow between ohmic contact 70 and layer M. The conductor that extends between metal contact 70 and contact pad 72 lies on both the upper surface of the photodetector layer PD and the exposed upper surface of the contact layer C within cavity 30. Therefore, it has a step formed in its length.

Figure 8:
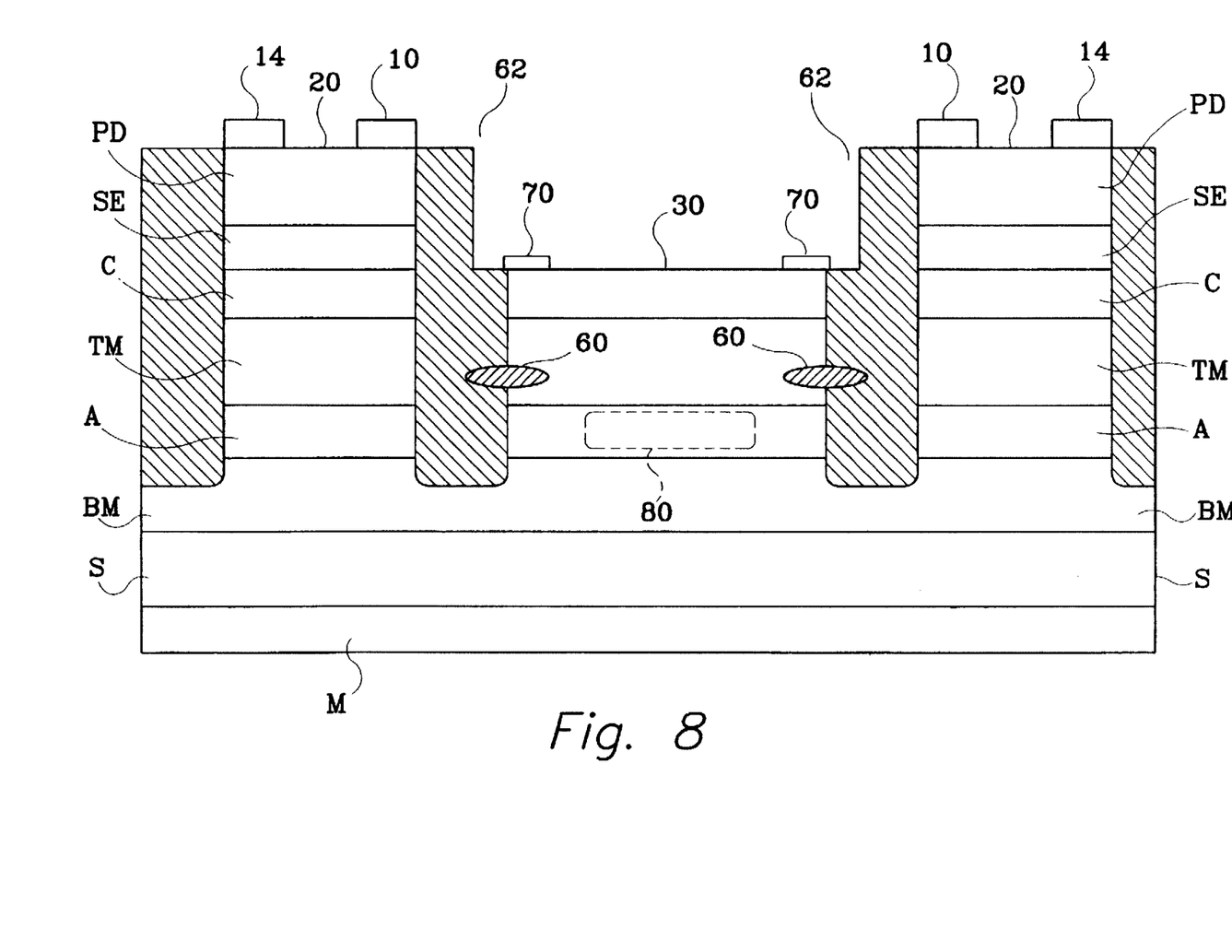
FIG. 8 is a more detailed view of FIG. 6.

FIG. 8 is a more detailed illustration of the device shown in FIG. 6. It shows the physical relationship between the gain guide implant 60 and the isolation implant 62 with respect to the ohmic metal contacts 70 within the cavity. Dashed box 80 illustrates the active region within the active layer A where lasing occurs. Light emitted from the active region passes upward through the top mirror TM and within the opening of the circular ohmic metal contact 70. Light received downward on the photodetector region 20 between the two concentric conductors, 10 and 14, creates a responsive conductance of the photodetector layer PD that can be sensed from an increase in current flow between the concentric conductors, 10 and 14.

Figure 9:
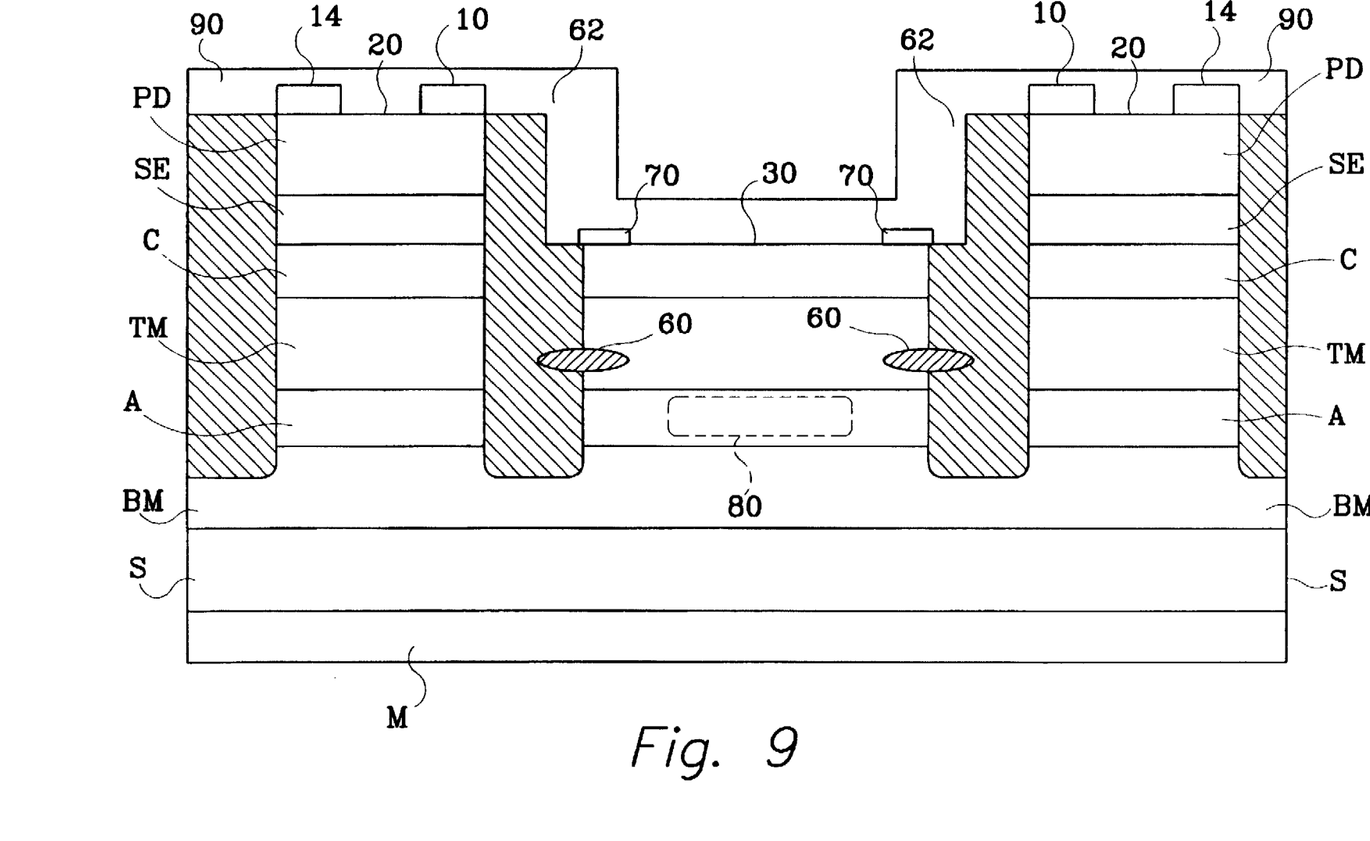
FIG. 9 is the same as FIG. 8 except with an additional dielectric layer designed to passivate the VCSEL and photodetector surfaces and minimize reflections at the surface of the photodiode.

FIG. 9 shows the representation illustrated in FIG. 8, but with an added dielectric layer 90 disposed over the top of all of the upper surface of the device. The dielectric layer would typically have a thickness equal to one half the wavelength of the light emitted by the vertical cavity surface emitting laser. The dielectric layer would typically be made of silicon dioxide or silicon nitride. It is provided for the purpose of passivating the surface and reducing reflections of incident light from the surface of the photodetector. Since the dielectric layer would have a constant thickness throughout its entire structure, it should be noted that small perturbations would typically occur in the upper surface of the dielectric layer. However, these perturbations, where the upper surface of the photodetective layer PD have the conductors, 10 and 14, disposed on it, are not shown in the Figures. In addition, it should be understood that many of the dimensions of the Figures have been exaggerated for purpose of clarity and simplicity of illustration. The various thicknessess of the layers and implant areas have been exaggerated and are therefore not drawn to scale. For example, the inner diameter of the ohmic metal contact 70 is approximately 15 microns and its outer diameter is approximately 35 microns. The inner diameter of the contact identified by reference numeral 14 is approximately 300 microns and the outer diameter of the contact identified by reference numeral 10 is approximately 125 microns.

Figure 10:
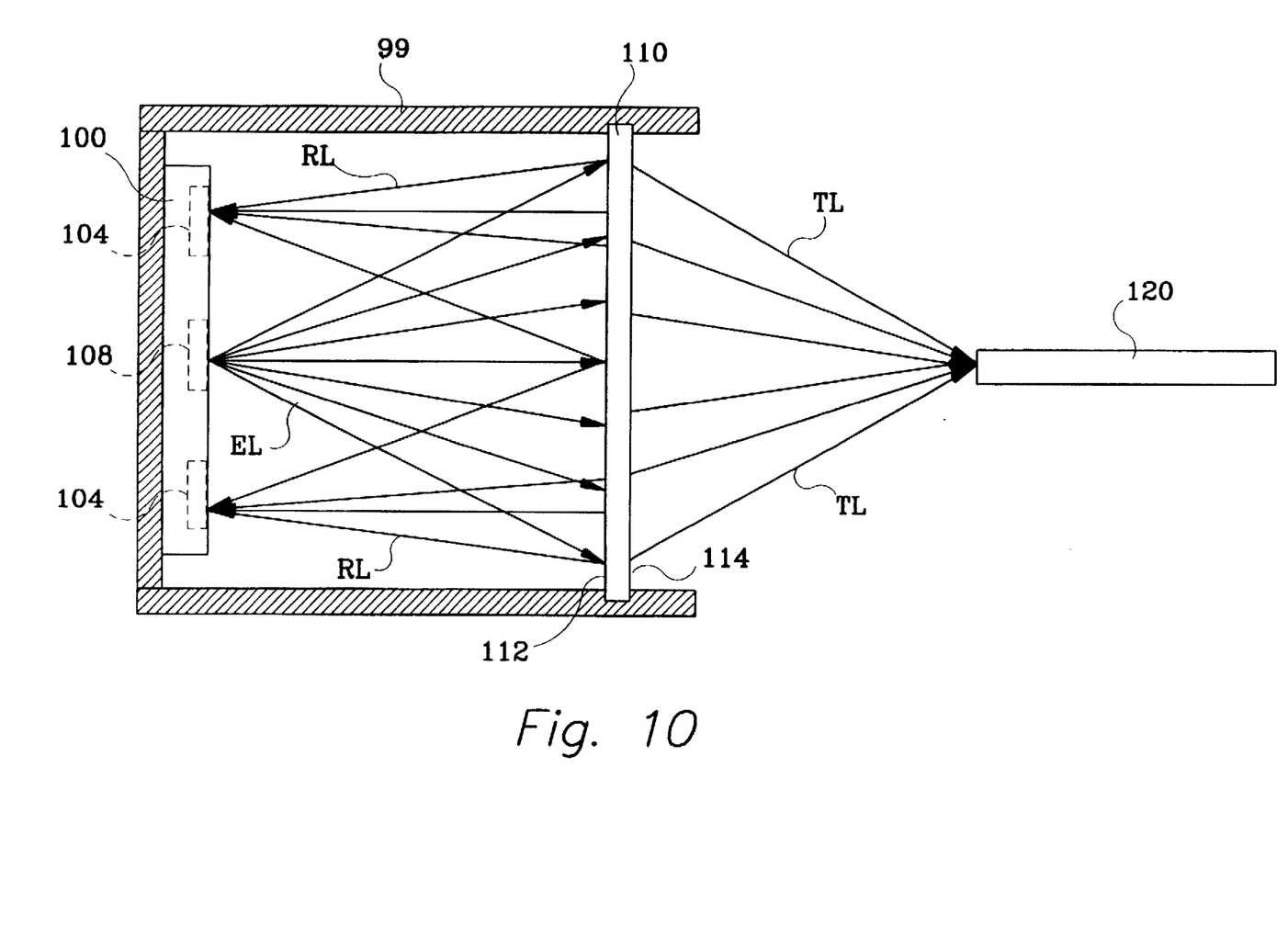
FIGS. 10 and 11 show alternative applications of a window that is partially reflective and partially transmissive.

In order to fully utilize the capability of the present invention, which provides both a laser and a photodetector in a common structure, the semiconductive device described above would typically be disposed within a container that is provided with a window through which the light can pass after being emitted by the laser. FIG. 10 shows an exemplary illustration of this type of structure. Reference numeral 100 is used in FIG. 10 to represent the total structure shown in FIG. 9 and described above. By dashed lines in FIG. 10, the photodetector regions 104 and the laser portion 108 of the device 100 are schematically represented. From the laser 108, emitted light EL passes toward a window 110. The window 110 is provided with an inside surface 112 and an outside surface 114. As shown in FIG. 10, the inside surface 112 faces the laser 108 and the photodetector 105. The outside surface 114 faces away from these components. The window 110 is partially reflective and partially transmissive. A portion of the emitted light EL from the laser 108 is reflected back toward the photodetector 104 as reflected light RL. The remaining portion of the emitted light EL passes through the window 110 as transmitted light TL. The reflected light RL is a uniform sample of all of the light emitted from the laser. In other words, the window reflects an equal percentage of the light incident on any part of the window. This prevents problems that could otherwise be associated with modal noise. In a preferred embodiment of the present invention, the inside surface 112 of the window 110 is shaped to cause the reflected light RL to be focused in a first predetermined pattern. In a particularly preferred embodiment of the present invention, the first preselected pattern is annular in shaped. The arrows in FIG. 10 represent this annular shaped pattern. The emitted light EL from the laser which is reflected back toward the photodetector 104 is directed back in such a way that it strikes the photodetector to provide an annular area of illumination that avoids the laser 108. In other words, the reflected light RL strikes the device 100 to illuminate an annular pattern on its surface that is generally coincident with the circular photodetector 104. The laser 108 lies within the annular pattern and generally does not receive the reflected light RL. The transmitted light TL passing through the window 110 is focused in a second predetermined pattern that causes it to fall predominately on a light transmissive object such as optical fiber 120. By shaping the inside surface 112 and the outside surface 114 of the window 110, the efficiency and accuracy of the device is significantly increased. Under certain circumstances, light reflected by the window 110 could otherwise fall on the laser or outside the region of the photodetector. The selective reflection provided by the inside surface 112 of the window 110 avoids these deleterious and wasteful results and also improves the operation of the laser. It is important, if the photodetector is used to monitor the output power of the laser, that the light received by the photodetector is an accurate and consistent proportion of the light transmitted through the window 110. Otherwise, the monitoring ability of the photodetector is severely jeopardized.

Figure 11:
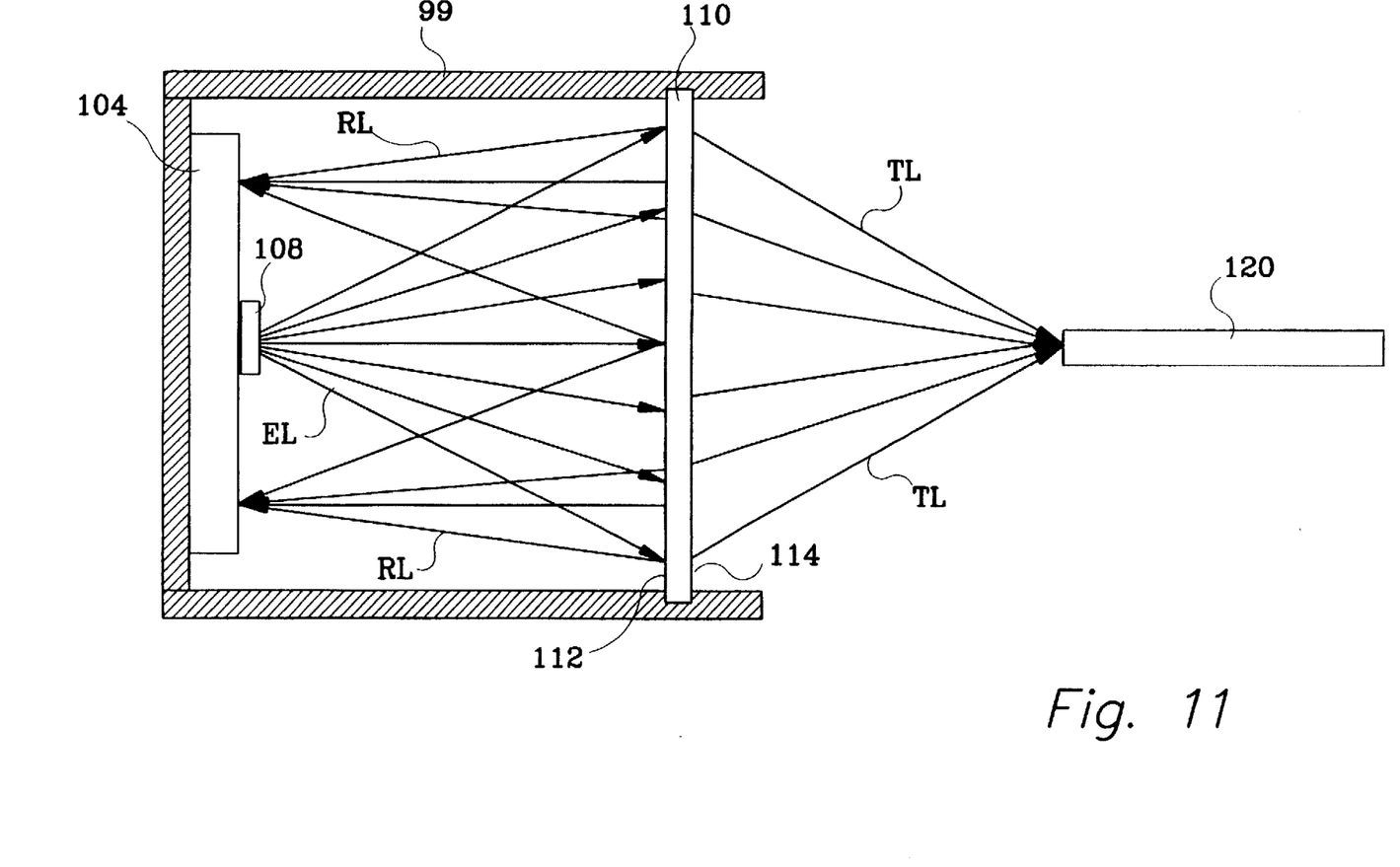

FIG. 11 is generally similar to FIG. 10, but with a slightly different configuration regarding the photodetector 104 and laser 108. In FIG. 11, the laser 108 is a discrete component that is attached to the photodetector 104 after the two individual subcomponents are manufactured. The illustration in FIG. 11 shows a photodetector 104 and a discrete laser 108 that are not formed as part of a monolithic structure.

Figure 12:
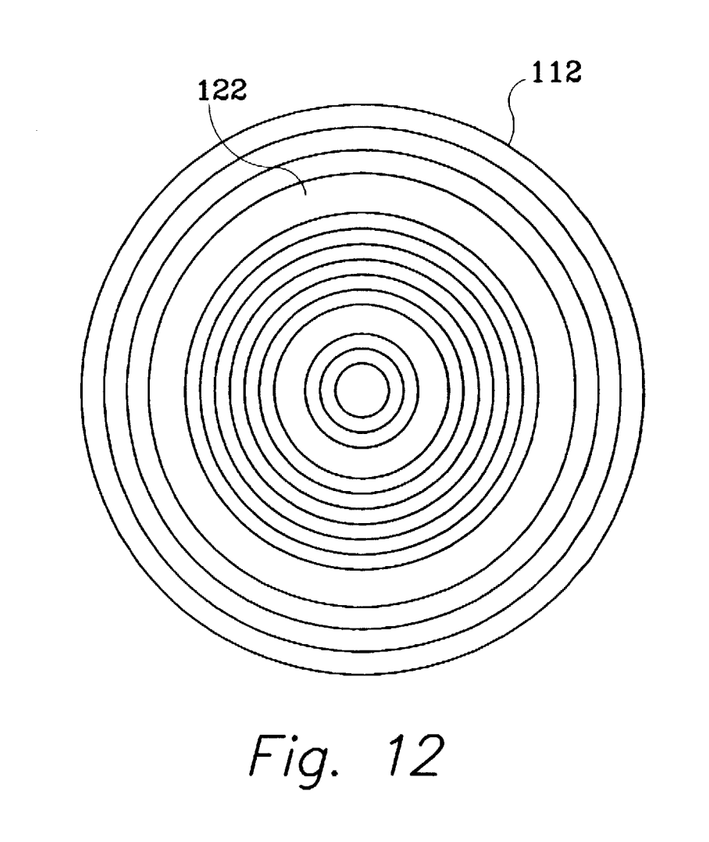
FIGS. 12 and 13 show the inside and outside surfaces of the window.
Figure 13:
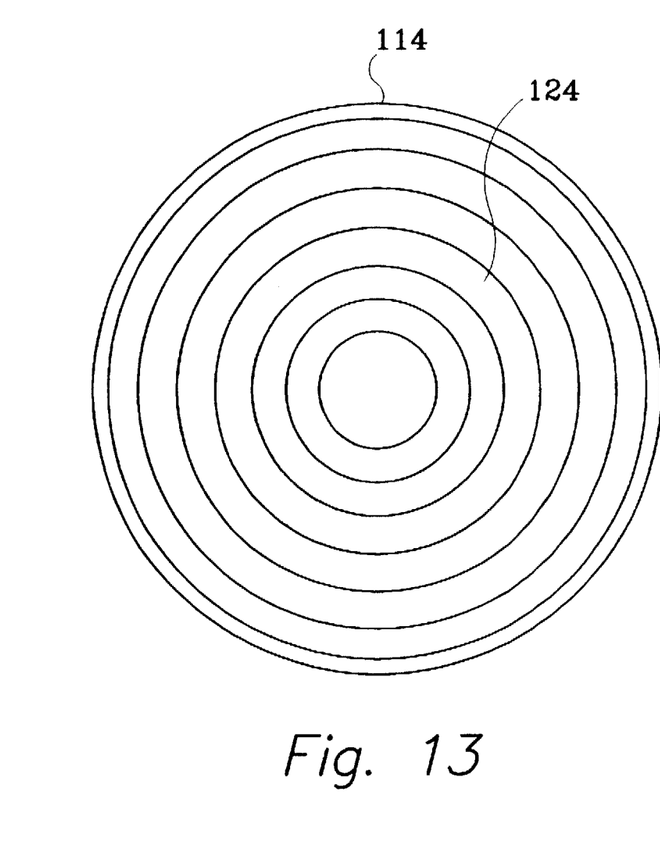

FIGS. 12 and 13 show the inside surface 112 and the outside surface 114, respectively, of the window 110 described above in conjunction with FIGS. 10 and 11. The inside surface 112 of the window 110 is provided with a plurality of concentric rings 122 that are shaped into the inside surface to cause it to selectively reflect the light from the laser back toward the photodetector in a first preselected pattern. Although many preselected patterns could be implemented, a particularly preferred pattern reflects the light to concentrate it in an annular shape as described above. This concentration of the light in an annular pattern serves the purpose of avoiding the results described above wherein the light can fall on the laser itself or outside the boundaries of the photodetector. The outside surface 114 of the window 110 is shaped to focus the transmitted light in a second predetermined pattern. The second predetermined pattern concentrates the light on a light transmissive member, such as an optical fiber. These specific shapes of the concentric rings in FIGS. 12 and 13 are selected, according to optical principles that are generally known to those skilled in the art, to satisfy the goals of reflecting light in the first preselected pattern and transmitting light in the second preselected pattern. The combination of this particular reflectance pattern and particular transmission pattern serves the purpose of improving the efficiency of the device shown in FIGS. 10 and 11 in two ways. First, it allows the device to more effectively monitor its own output power. Secondly, it improves the light transmission of the device for more efficient use in communications systems.

The inside surface 112 and the outside surface 114 each will consist of a diffractive phase element that is specifically implemented for the transformation or function intended for each of the surfaces. As is well known to those skilled in the art, a diffractive optic is an optical element that uses diffraction to control wavefronts. With regard to the preferred embodiment of the present invention, the diffractive optic can be any optical device which utilizes diffraction to transform a point source intensity distribution into another desired intensity distribution, such as an annular ring or another point source distribution. Typical examples of a diffractive optic are zone plates, volume holographic lenses, surface relief conform lenses, holographic lenses, binary optics, computer generated holograms, and diffraction gratings. Fabrication methods that are usable in the manufacture of diffractive optics include diamond machining, interference of coherent beams, and several forms of advanced microlithographic and etching techniques. Diffractive optics may be manufactured in large quantities by several replication methods, such as injection molding, embossing, and replicative transfer.

With reference to FIGS. 12 and 13, it should be clearly understood that the actual phase contours of the inside surface 112 and outside surface 114 will typically be much denser than illustrated in the Figures. However, the design and specification of the mathematical prescription defining the diffractive element on each of the two surfaces is very well known to those skilled in the art and familiar with modern optical design tools and methods. The distribution and shape of the phase contours typically specify the optical function embodied in the diffractive element and the surface profile, or blaze, specifies the efficiency with which light is directed into one diffraction order. The lens used in conjunction with the preferred embodiment of the present invention involves the general principle that a diffractive element has a high efficiency in reflection and has a low efficiency in transmission, or vice versa. The diffractive element on the inner surface 112 is designed to be efficient in the first order in reflection. The fraction of the incident light that is directed back into the power monitor detector by the lens equals the product of the efficiency times the reflectance of the inner surface 112. A fraction, equivalent to one minus the reflectance, of the incident light is transmitted by the inner surface 112 to the outer surface 114. Because the inner diffractive element is very inefficient in transmission, most of the transmitted light occurs in the zero diffractive order. In other words, approximately 80 percent of the transmitted light behaves as if the inner diffractive element is not present. The light transmitted in zero order is then affected by the diffractive element on the outer surface 114 to focus it. The diffractive element on the outer surface is machined to have a high efficiency in transmission. The distribution of light between reflected component and transmitted component can be controlled and adjusted by deposition of a film of specified reflectance on the innersurface. For purposes of safety and the prevention of damage to an operator's eyes, it may be advantageous to adjust the first order efficiency of the diffractive element on the outer surface 114 to be less than maximum in order to cause some of the light to diverge in higher orders at large angles, thus minimizing potential hazards to an observer.

Figure 14:
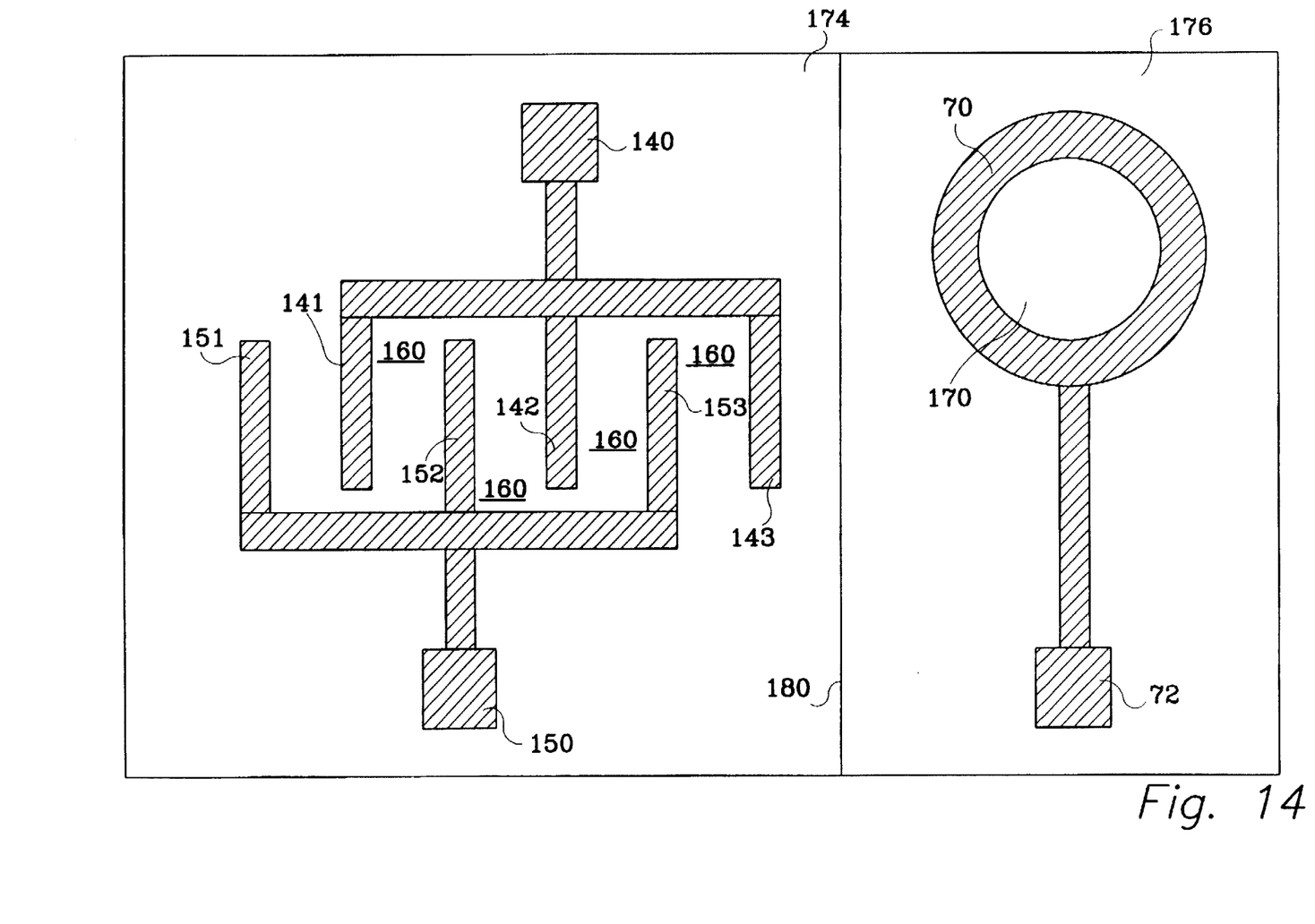
FIG. 14 shows an alternative embodiment of the present invention.

FIG. 14 shows an alternative embodiment of the present invention which is configured in a slightly different arrangement than that described above in conjunction with FIGS. 3, 5 and 7. In the description of FIGS. 3, 5 and 7, the laser and the photodetector were arranged concentrically with the photodetector being disposed around the laser. This particular arrangement, although advantageous in many applications where monitoring of the output power from the laser is necessary, is not required in all embodiments of the present invention. For example, the photodetector could comprise two conductors shaped as shown in FIG. 14. A first contact pad 140 is connected to a conductor that is shaped to have a plurality of fingers, 141, 142 and 143. Another contact pad 150 is connected to a conductor that is shaped to have a plurality of fingers, 151, 152 and 153. The fingers of the two structures are arranged to be in noncontact association with each other and to define a region of photodetector surface 160 between them. The structure shown at the left side of FIG. 14 would operate, as a photodiode, in a manner that is generally similar to the photodetector regions described above in the discussion of the other preferred embodiment of the present invention. At the right side of FIG. 14, the ohmic conductor 70 is shown connected to its contact pad 72. The central region 170 within the ohmic conductor 70 is the area through which the light is emitted by the laser. The purpose of FIG. 14 is to show that the photodetector and the vertical vacity surface emitting laser can be provided monolithically without having them arranged in a concentric pattern. In other words, the monolithic structure shown in FIG. 14 has a photodetecting region 174 and a laser region 176, divided by line 180, that are not concentric with each other. This allows the device to accommodate both transmitter and receiver channels on a semiconductor chip for parallel data communication links. Monolithic integration allows the device to match this semiconductor chip to a single fiber optical connector for both transmitting and receiving channels, thus resulting in a significant cost savings.

Figure 15:
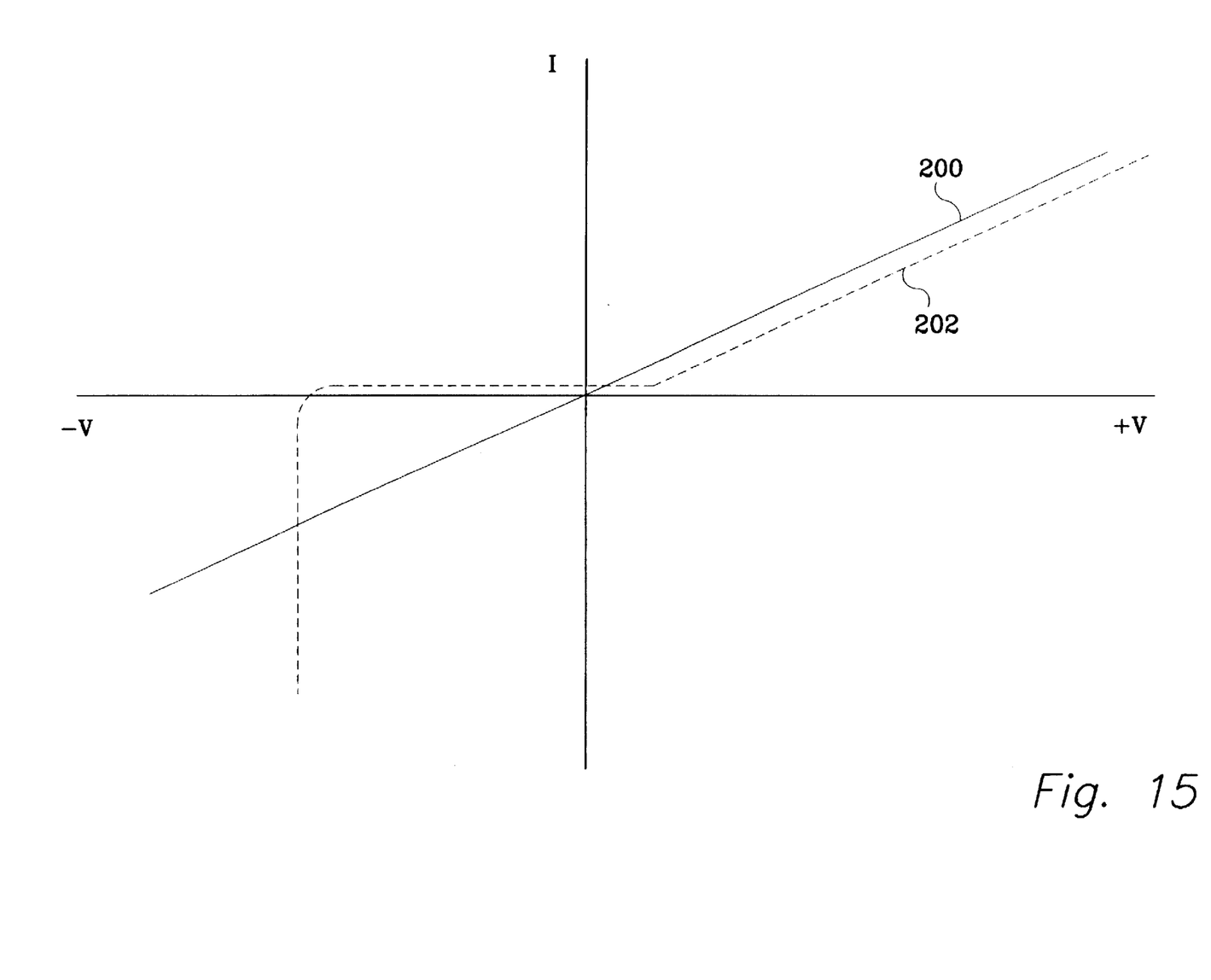
FIG. 15 shows the voltage versus current relationships for Schottky metals and ohmic metals.

In the description of the present invention, reference is made to Schottky metals and ohmic metals. FIG. 15 illustrates the differences between these two conductors. There are differences between Schottky metals and ohmic metals in electrical characteristics and, occasionally, in their composition. The solid line 200 in FIG. 15 shows the characteristic behavior of an ohmic metal contact to a semiconductor. As voltage increases or decreases, the current through the contact changes accordingly and in a generally linear relationship. A Schottky metal contact, on the other hand, behaves in the manner illustrated by dashed line 202 in FIG. 5. Schottky metals are particularly designed not to react metallurgical with semiconductor materials and form a planar interface. An example would be a thin titanium layer, approximately 50 to 200 angstroms thick on top of which any amount of gold contact can be provided. An ohmic metal contact can be formed by doping the semiconductor very heavily, as with $3 \times 10^{19}$ carbon, zinc or beryllium per cubic centimeter for P-type conductivity materials or $5 \times 10^8$ silicon or tellurium per cubic centimeter for N-type conductivity material. The carriers are transferred easily to the semiconductor and any metal can be used, even metals that are typically used as Schottky metals. Alternatively, an element is placed in the metal which will diffuse into the semiconductor and dope it. For example, zinc in a gold/zinc contact will dope P-type material into the semiconductor. As a third alternative for forming an ohmic contact, a metal is deposited which will form a third compound with a semiconductor, wherein this intermediate compound allows easy current flow. For example, nickel-germanium-gold will react with gallium arsenide to form an intermediate nickel-germanium-gallium compound. With reference to FIG. 7, the conductors identified by reference numerals 10, 14, 12 and 16 are Schottky metals. The metals identified by reference numeral 70 and 72 are ohmic metals.

The present invention, in a particularly preferred embodiment, relates to a monolithic integration of a vertical cavity surface emitting laser and a photodetector which can be arranged as single pairs or arrays. Each pair can be arranged in a side by side configuration or concentrically. These arrangements allow the photodetector to monitor the output power of the VCSEL or, alternatively, reduce connector costs by providing a precise spacing between photodetectors and VCSEL's. In a device made in accordance with the present invention, an epitaxial growth involves the deposition of the layers required for the VCSEL, followed by the layers required for the photodetector. For a VCSEL, an N-type layer is grown first and then the active region followed by the P-type mirror. An aluminum arsenide stop etch layer SE, which is approximately 100 nanometers thick, is then grown, followed by an undoped gallium arsenide photodetector layer PD, which is approximately 1 micrometer thick. The gallium arsenide photodetector PD serves as the absorption layer for the photodetector. This process can then be followed by additional layers which can be used for the fabrication of field effect transistors. For instance, the capability with complementary heterostructure field effect transistor (CHFET) technology, additional channel, barrier and contact layers would be deposited. The processing of the VCSEL would involve a selective etch to remove the layers above the VCSEL, including the thick gallium arsenide photodetector layer PD. Then the aluminum arsenide stop etch layer SE would also be removed. At this point during the manufacturing process, standard VCSEL processing steps would be followed, including deposition of the top P-type ohmic contact layer, gain guide implant and the isolation implant, and the deposition of the metal on the back side of the wafer. The photodetector fabrication would then involve the deposition of Schottky metal in the case of a metal-semiconductor-metal, or MSM, detector or deposition of ohmic metals and ion implantation in the case of a photoconducting or pin detector. The ability to use photolithography and wafer level processing allows the photodetector to be located very accurately with respect to the laser to achieve accuracy of one micrometer or better. This may also result in reduced costs due to the reduction in wafer area required and elimination of separate packaging and processing steps. The integrated chips can also be combined with packaging approaches to address the need for monitoring the output of a laser diode for data communication applications as described above. Separate photodetectors would be used for the laser output monitoring function and for data communications channels. The integrated chip can also be applied in such a way as to reduce packaging costs. Again, since the distance between the photodetector and the VCSEL is very well known, array connector techniques can be used to create a connector which brings an optical fiber to both the VCSEL and the photodetector simultaneously. This procedure can be extended to arrays so that all channels, both ingoing and outgoing, are combined into a single connector and receptacle. This approach can reduce chip, receptacle and connector costs.

Although the present invention has been described with particular detail and illustrated with significant specificity, it should be understood that alternative embodiments of the present invention are also within its scope.

The embodiments of the invention in which an exclusive property or right is claimed are defined as follows:

1. A semiconductive device, comprising:
   a laser; and
   a metal-semiconductor-metal photodetector, said laser and said photodetector formed on a common substrate and disposed in a common structure.
2. The device of claim 1, further comprising:
   said laser being a vertical cavity surface emitting laser.
3. The device of claim 1, wherein:
   said laser comprises a plurality of layers which form a light emitting structure; and
   said photodetector comprises a photosensitive layer disposed over said light emitting structure, a portion of said photosensitive layer being etched to form a cavity which exposes said light emitting structure.
4. The device of claim 3, wherein:
   said cavity is surrounded by said photosensitive layer.
5. The device of claim 3, wherein:
   said laser and said photosensitive layer are arranged in a side by side relationship.
6. The device of claim 1, wherein:
   said photodetector and said laser are disposed within a common container.
7. The device of claim 6, wherein:
   said common container comprises a transparent window, said window being partially reflective and partially transmissive, a portion of light emitted by said laser being reflected toward said photodetector.
8. The device of claim 3, wherein:
   the photodetector further comprises a plurality of conductors placed in electrical contact with said photosensitive layer.
9. The device of claim 8, wherein:
   said photosensitive layer is a single layer.
10. The device of claim 8, wherein:
    said photosensitive layer is a single layer of undoped semiconductor material.
11. The device of claim 8, wherein:
    said conductors are metal.
12. The device of claim 8, wherein:
    said conductors are Schottky metal.
13. The device of claim 8, wherein:
    said conductors are substantially annular and concentric.
14. The device of claim 8, wherein:
    said conductors are interdigitated.
15. The device of claim 3, wherein:
    said etched cavity does not impinge upon said light emitting structure.
16. The device of claim 3, wherein:
    all said layers are epitaxially formed.

17. The device of claim 1, wherein:
    the photodetector is constructed and arranged to measure lasing light output.
18. The device of claim 3, wherein:
    the photodetector is constructed and arranged to measure lasing light output.
19. The device of claim 9, wherein:
    the photodetector is constructed and arranged to measure lasing light output.
20. A semiconductive device, comprising:
    a laser; and
    a photodetector formed from a single semiconductor layer,
    said laser and said photodetector disposed on a common substrate,
    said laser being a vertical cavity surface emitting laser.
21. The device of claim 20, wherein:
    said laser comprises a plurality of layers which form a light emitting structure; and
    said photodetector comprises a photosensitive layer disposed over said light emitting structure, a portion of said photosensitive layer being etched to form a cavity which exposes said light emitting structure.
22. The device of claim 21, wherein:
    said cavity is surrounded by said photodectector.
23. The device of claim 20, wherein:
    said laser and said photodector are arranged in a side by side relationship.
24. The device of claim 20, wherein:
    said photodetector and said laser are disposed within a common container.
25. The device of claim 24, wherein:
    said common container comprises a transparent window, said window being partially reflective and partially transmissive, a portion of light emitted by said laser being reflected toward said photodetector.
26. A semiconductive device, comprising:
    a laser; and
    a metal-semiconductor-metal photodetector, said laser and said photodetector disposed in a common structure,
    said laser being a vertical cavity surface emitting laser,
    said laser comprising a plurality of layers which form a light emitting structure,
    said photodetector comprising a single photosensitive epitaxial layer with a plurality of conductors disposed thereon, said conductors and photosensitive layer forming a photodiode structure, said photodetector disposed over said light emitting structure, a portion of said photosensitive layer being etched to form a cavity which exposes said light emitting structure.
27. The device of claim 26, wherein:
    said laser and said photosensitive layer are epitaxially formed on a common substrate.
28. The device of claim 26, wherein:
    said cavity is surrounded by said photosensitive layer.
29. The device of claim 26 wherein:
    said laser and said photosensitive layer are arranged in a side by side relationship.
30. The device of claim 26, wherein:
    said photodetector and said laser being disposed within a common container, said common container comprising a transparent window, said window being partially reflective and partially transmissive, a portion of light emitted by said laser being reflected toward said photodetector.

* * * * *